(12) United States Patent
Yang et al.

(10) Patent No.: US 6,642,106 B1
(45) Date of Patent: Nov. 4, 2003

(54) METHOD FOR INCREASING CORE GAIN IN FLASH MEMORY DEVICE USING STRAINED SILICON

(75) Inventors: Nian Yang, San Jose, CA (US); Hyeon-Seag Kim, San Jose, CA (US); Zhigang Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/159,323

(22) Filed: May 31, 2002

(51) Int. Cl.[7] .............................................. H01L 21/336
(52) U.S. Cl. ...................... 438/257; 438/167; 438/933; 438/938
(58) Field of Search ................................ 438/167, 257, 438/933, 938

(56) References Cited

U.S. PATENT DOCUMENTS 5,891,769 A * 4/1999 Liaw et al. .................. 438/167
6,403,981 B1 * 6/2002 Yu ............................... 257/63

2002/0011603 A1 * 1/2002 Yagishita et al.
2002/0185691 A1 * 12/2002 Cabral, Jr. et al.

* cited by examiner

Primary Examiner—David Nelms
Assistant Examiner—Dao H. Nguyen
(74) Attorney, Agent, or Firm—Wagner, Murabito & Hao LLP

(57) ABSTRACT

A method of memory device fabrication. In one embodiment, the method of memory device (400) fabrication comprises implanting an element (200) in a substrate (440). The element (200) causes an inherent elongational realignment of atoms in silicon (101,102) when silicon (100) is formed (471) upon the substrate (440) with the element (200) implanted therein. A layer of silicon (100) is formed (471) on the substrate having the element (200) implanted therein (470), wherein alignment of atoms (101) of the silicon elongates (102) to an atomical alignment equivalent (101g) to said element (200). The layer of silicon (471) and the substrate (470) are crystallized subsequent to the elongational realignment of atoms of the layer of silicon (101g), wherein a crystallized layer of elongated silicon (101g) decreases electron scattering thus realizing increase core gain in the memory device (400).

7 Claims, 21 Drawing Sheets

300

700

Implanting an element in a substrate. The element causes an elongational realignment of atoms in silicon when silicon is formed upon said substrate with the element implanted therein.
702

Forming a layer of silicon on the substrate having the element implanted therein, wherein the alignment of atoms of the silicon elongates to an atomical alignment equivalent to the element.
704

Crystallizing the layer of silicon and the substrate, subsequent to the elongational realignment of atoms of the formed layer of silicon, wherein a crystallized layer of elongated silicon decreases electron scattering thus realizing increased core gain in the memory device.
706

```
┌─────────────────────────────────────────────────────────┐
│  Heightening a portion of a depletion layer disposed within a  │
│  substrate to be in between and separate from a source region and │
│           a drain region of the memory device.          │
│                          802                            │
└─────────────────────────────────────────────────────────┘
                            │
                            ▼
┌─────────────────────────────────────────────────────────┐
│  Forming a channel in the substrate. The channel is through which │
│  electrons flow from the source region to the drain region during │
│                   memory device operation.              │
│                          804                            │
└─────────────────────────────────────────────────────────┘
                            │
                            ▼
┌─────────────────────────────────────────────────────────┐
│  Controlling the heightening of the portion of the deletion layer so │
│  that the heightened portion of the depletion layer is above a lowest │
│  junction depth of the source region and above a lowest junction │
│  depth of the drain region in the substrate, and wherein a depletion │
│  layer with a heightened portion thereof inhibits electron leakage │
│          from the source region to the drain region.    │
│                          806                            │
└─────────────────────────────────────────────────────────┘
```

FIG. 8

METHOD FOR INCREASING CORE GAIN IN FLASH MEMORY DEVICE USING STRAINED SILICON

TECHNICAL FIELD

The present invention relates a flash memory device. More particularly, the present invention relates to substrates in a flash memory device.

BACKGROUND ART

A flash memory device is a type of EEPROM (electrically erasable programmable read only memory) and is fast becoming a common device to store information. Today's flash memory devices are being used in numerous electronic devices including, but not limited to, digital cameras, MP3 players, laptop computers, personal digital assistants (PDAs), video game consoles, and the like. It is noted that numerous printers, e.g., inkjet, laser, and dedicated photograph printers are also being configured with flash memory drives to read flash memory devices. A flash memory device provides both the speed of volatile memory (RAM-random access memory) and the data retentive qualities of non-volatile memory (ROM.-read only memory). Additionally, with continued miniaturization of components and circuitry within an electronic system, flash memory devices are well suited to be incorporated into the diminutively sized systems.

As flash memory technology progresses, increased memory density and speed become critical. Writing to a flash memory cell and erasing a flash memory cell are slow when compared to reading of a flash memory cell. To read a cell, it is necessary to ensure that the drain current (also the reading current of the cell) is large enough to drive the output and to be able to control the level of the drive output buffer and speed. The speed with which the cell is read is determined by several factors including, but not limited to, the channel length of the device, e.g., a MOSFET (metal oxide semiconductor field emitting transistor), the threshold voltage, and gate oxide thickness.

To provide additional speed, the channel length has been continuously decreased to increase density and drive current for improved core gain, thus increasing speed of the device. However, there is a fundamental limit on the gate oxide or tunnel oxide thickness for flash memory due to reliability reasons. The tunnel oxide can not be scaled aggressively thin by virtue of the high voltage operations it undergoes during writing (programming) and erasing. This limits the core gain as the device is scaled down in terms of channel length.

Further, to comply with new diminutive form factors and other reduced size requirements, scaling down (size reduction) of the flash memory device is not without shortcomings. Scaling down of a flash memory device can cause problems with the internal effects of the flash memory device, e.g., degradation of the drive current, arising because of serious resistance from substrate doping problems.

Doping problems can include not driving the dopant deep enough into the substrate, or driving the dopant too deep into the substrate. Other problems can include having an excessively concentrated dopant, and conversely, having an insufficiently concentrated dopant. The amount of dopant concentration affects the operation of the transistor and, accordingly, the flash. memory device.

The dopant concentration is even more critical as flash memory devices become smaller and smaller and channel length decreases and where increased speed is demanded. A higher concentration of dopant will increase the $V_t$ (threshold voltage) of the transistor while reducing associated leakage, which unfortunately reduces the speed at which the transistor can operate. The leakage is between the source and drain of the transistor. Additionally, if the dopant concentration is too high, thus a high $V_t$, a greater $V_g$ (gate voltage) is required to provide enough overdrive to overcome the higher $V_t$ and enable reading of the cell.

A lower concentration of dopant increases the speed with which the transistor can operate. It is noted, however, that a lower concentration of dopant will alsodecrease the $V_t$ of the transistor and, unfortunately, increase associated leakage between the source and the drain. Further, because of the increase in leakage between the source and the drain, transistor functionality and reliability can be adversely affected with a dopant having too low of a concentration.

Thus, a need exists for a method to increase the speed in which a flash memory device is read. Another need exists for a method that increases core gain while maintaining a dopant concentration that provides the lowest threshold voltage and the least amount of leakage between the source and the drain. Yet another need exists for a method that increases core gain in a flash memory device while retaining device functionality and reliability.

DISCLOSURE OF THE INVENTION

Embodiments of the present invention are drawn to providing a method and apparatus for a memory device, e.g., a flash memory device, with increased core gain, through the formation and utilization of strained silicon. The present invention further provides a method and apparatus for a memory device which achieves a reduction in electron scattering. The present invention further provides a method and apparatus for a memory device that achieves the above and which is readily implementable in a memory device fabrication process.

A method of memory device fabrication is described. In one embodiment, the method of memory device fabrication comprises implanting an element in a substrate. The element causes an inherent elongational realignment of atoms in silicon when silicon is formed upon the substrate when the element is implanted therein. A layer of silicon is then formed on the substrate having the element implanted therein. The alignment of atoms of the silicon elongates to an atomical alignment equivalent to that of the element. The layer of silicon and the substrate are then crystallized, subsequent to the elongational realignment of atoms of said layer of silicon, wherein a crystallized layer of elongated silicon decreases electron scattering thus realizing increased core gain in the memory device. In one embodiment, the element implanted in the substrate is germanium.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 7 is a flowchart depicting steps in a process of memory device fabrication, in accordance with one embodiment of the present invention.

FIG. 8 is a flowchart depicting steps in a process of channel engineering performed upon a memory device, in accordance with one embodiment of the present invention.

BEST MODES FOR CARRYING OUT THE INVENTION

A method of memory device fabrication is described. In the following description, for purposes of explanation, numerous specific details are set forth in order to provide a thorough understanding of the present invention. To one skilled in the art, the present invention may be practiced without these specific details. In other instances, well-known structures and devices are shown in block diagram form in order to avoid obscuring the present invention.

Some portions of the detailed descriptions, which follow, are presented in terms of procedures, steps, processing, and other symbolic representations of operations that can be performed on memory devices. These descriptions and representations are the means used by those skilled in the memory device fabrication arts to most effectively convey the substance of their work to others skilled in the art. A procedure, step, process, etc., is here, and generally, conceived to be a self-consistent sequence of steps or processes leading to a desired result. The steps are those requiring physical manipulations of physical structures. It should be borne in mind, however, that all of these and similar terms are to be associated with the appropriate physical structures and processes and are merely convenient labels applied to these structures and processes.

The present invention is discussed primarily in the context of a memory device, such as a flash memory device. However, the present invention can be used with other types of memory devices that have the capability to have information/data stored, manipulated, and/or removed, including, but not limited to, flash memory devices.

While the present invention is discussed in the context of fabrication of a flash memory device, it is noted that embodiments of the present invention provide a method for implementing strained silicon in a memory device that can be readily adapted for inclusion in nearly any memory device fabrication process.

Further, in accordance with one embodiment of the present invention, it is noted that the formation of strained silicon and integration of strained silicon into a memory device can be readily added to nearly any memory device fabrication process. It is also noted that by readily and simply incorporating strained silicon into existing memory device fabrication processes, a substantial cost savings can be realized when compared to a extensive retooling of the fabrication process.

Figure 1A:
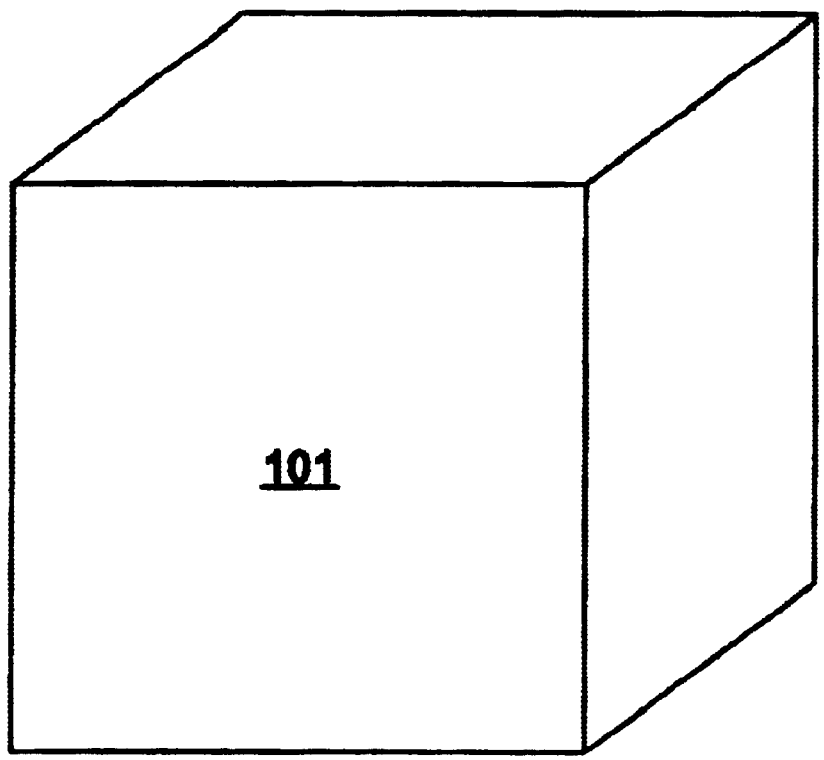
FIG. 1A is a block representing an atomical size of a molecular structure of silicon, in accordance with one embodiment of the present invention.

FIG. 1A is an illustrated block portion 101 of crystallized silicon 100. Block portion 101 depicts an atomical alignment within a molecular structure of crystallized silicon 100.

Figure 1B:
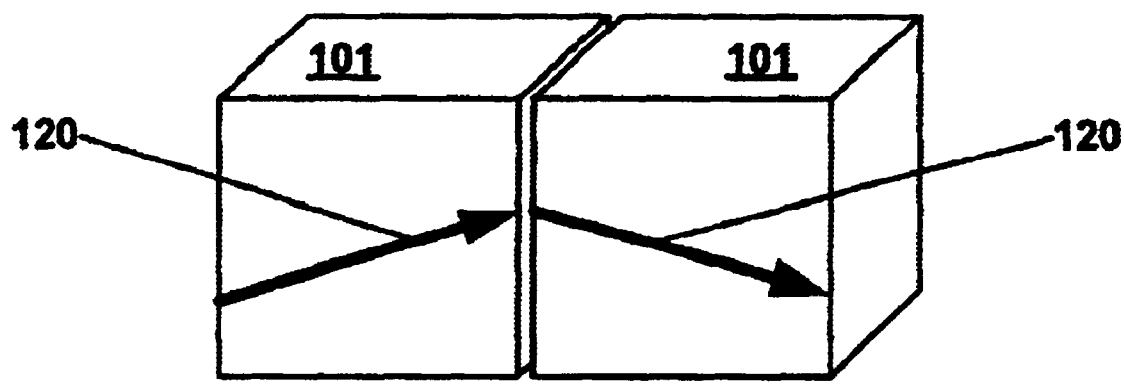
FIG. 1B is a plurality of blocks of FIG. 1A depicting electron scattering during an electron flow therethrough, in accordance with one embodiment of the present invention.

FIG. 1B shows a plurality of block portions 101, e.g., blocks 101a and 101b, proximally disposed. Arrows 120 depict a left to right electron flow through the molecular structure of silicon block portion 101a and then continuing through block portion 101b. When the flow of electrons through the molecular structure of silicon block portion 101a reaches the termination point of structure 101a scattering occurs, because molecular aligning between adjacent structures, e.g., block portions 101a and 101b, is nearly impossible. Scattering is a deflection of or a disturbance in the mean flow path (MFP) of the electrons, and is represented by non-parallel arrows 120 in FIGS. 1A, 1B, and non-parallel arrows 220 in FIGS. 2A, 2B, 3A, and 3B.

It is well known that elements with smaller molecular alignment structures have a greater amount of electron scattering than an element having a larger molecular alignment structure, given analogous distances for the electrons to travel.

Figure 2A:
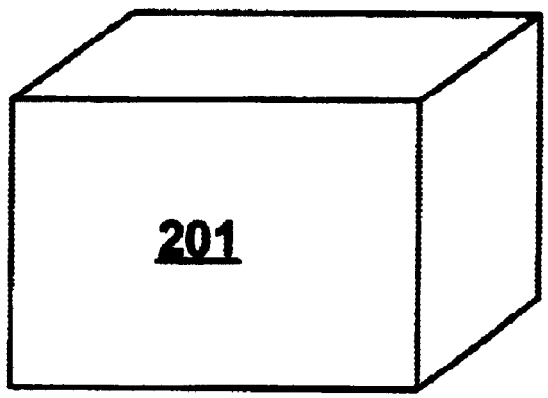
FIG. 2A is a block representing an atomical size of a molecular structure of another element, e.g., germanium, in accordance with one embodiment of the present invention.

FIG. 2A is an illustrated block portion 201 of crystallized germanium (Ge) 200. Block portion 201 depicts the atomical alignment within a molecular structure of crystallized germanium 200. It is noted that the atomical alignment of crystallized germanium is larger than the atomical alignment of crystallized silicon. This is depicted by silicon 100 of FIG. 1A being smaller than germanium 200 of FIG. 2A.

Figure 2B:
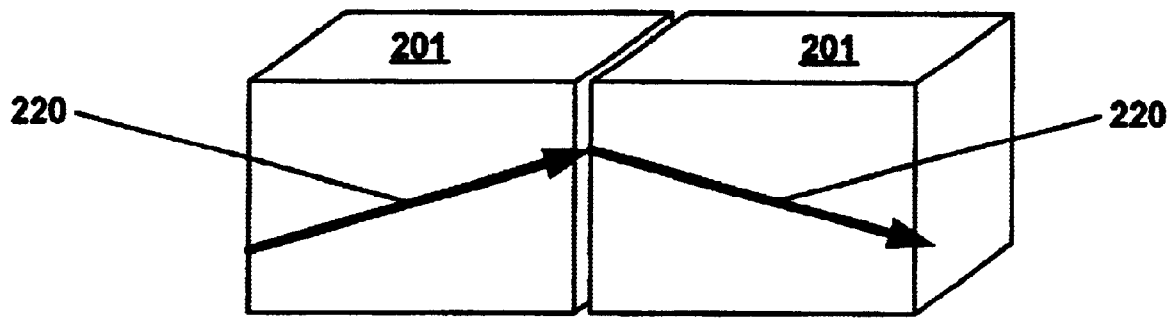
FIG. 2B is a plurality of blocks of FIG. 2A depicting electron scattering during an electron flow therethrough, in accordance with one embodiment of the present invention.

FIG. 2B shows a plurality of block portions 201, e.g., block portions 201a and 201b, proximally disposed. Arrows 220 are analogous to arrows 120 of FIG. 1B. When the flow of electrons through the molecular structure of germanium block 201a reaches the end of the crystallized molecular structure, scattering occurs, analogous to the scattering as described in FIGS. 1A and 1B. It is noted that by virtue of the length of the crystalline structures in block portions 201 being longer than those in block portion 101, arrows 220 are, accordingly, visibly longer than arrows 120.

Figure 3A:
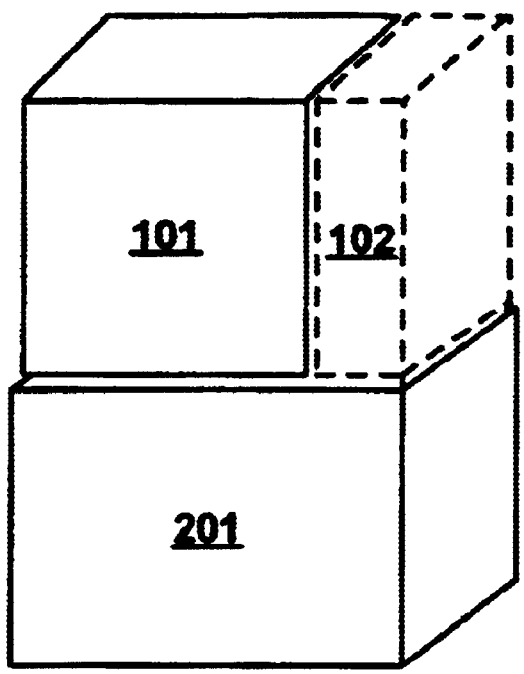
FIG. 3A is an illustration of a block of silicon of FIG. 1A grown on a block of another element of FIG. 2A, with a dotted line indicating inherent atomical realignment of the block of silicon of FIG. 1A to an atomical alignment equivalent to an atomical alignment of other element of FIG. 2A, in accordance with one embodiment of the present invention.

FIG. 3A is an illustration of a block portion 101 of silicon substrate 100 proximally disposed above a block portion 201 of a germanium substrate 200, in a silicon straining environment 300. In silicon straining environment 300, when silicon is formed upon a substrate with a larger atomical alignment structure, e.g., a germanium substrate as described in FIGS. 2A and 2B, the atoms in silicon 101 inherently realign themselves to become equivalent in atomical alignment to the substrate upon which the silicon was grown, germanium in this example, thus straining the silicon (also referred to as stretching) to an analogous atomical alignment, as indicated by dotted box 102.

Figure 3B:
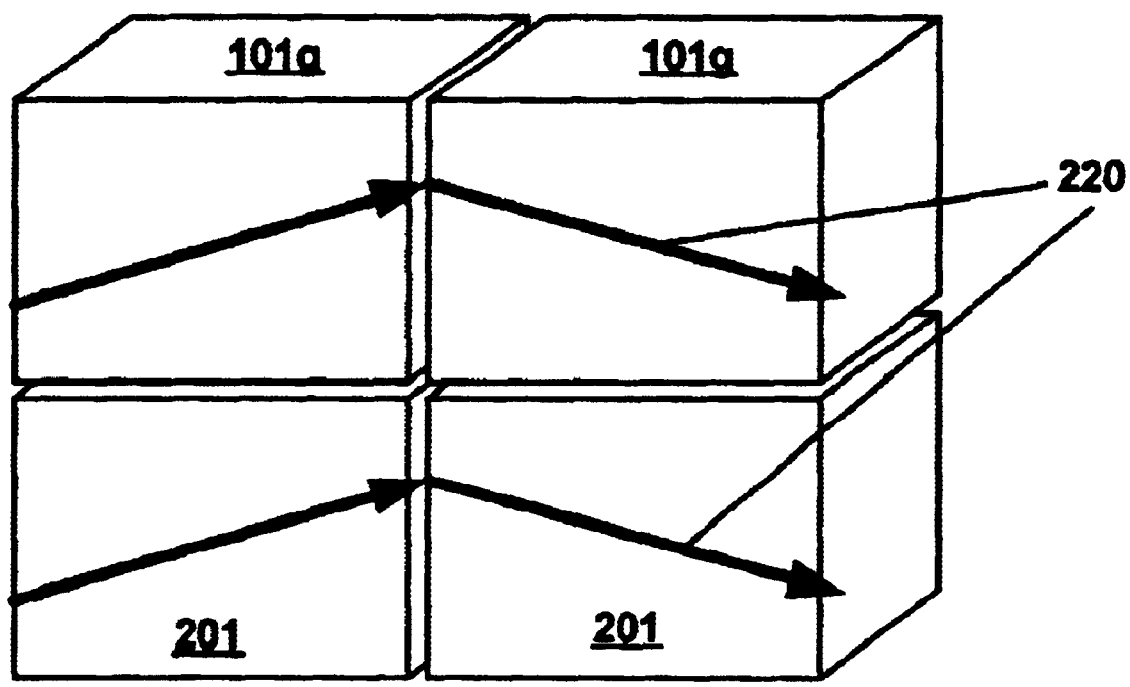
FIG. 3B is an illustration of a plurality of blocks of silicon of FIG. 3A grown on another element and having been atomically realigned to an equivalent atomic alignment, and depicting scattering during an electron flow therethrough, in accordance with one embodiment of the present invention.

FIG. 3B is an illustration of strained silicon 101g grown upon a germanium substrate 201, in one embodiment of the present invention. Because of the inherent properties of silicon in which the atomic alignment of the atoms in silicon will realign themselves to an equivalent atomical alignment of the substrate upon which the silicon is grown, arrows 220 are analogous in length. Additionally, arrows 220 indicate electron scattering, but because of the straining of the silicon, there is less scattering of the electrons in strained silicon crystalline structures than in non-strained silicon crystalline structures, per analogous distances.

It is specifically noted that an increase in drive current is realized when implementing strained silicon in a process of memory device fabrication. Additionally, another benefit is that the increase in drive current is realized while current Vt implant levels are maintained. Further, because current Vt implant levels are maintained, leakage in current between the source and drain is kept at the desired minimum or non-existent level.

FIGS. 4A through 4H depict preliminary processes and procedures performed upon a substrate, e.g., substrate 410, in a process of fabricating of a memory device 400. Memory device 400 can, in one embodiment, be a conventional flash memory device. In another embodiment, memory device 400 can be a flash memory device having shallow trench isolation. In another embodiment, memory device 400 can be a flash memory device having triple wells. In another embodiment, memory device 400 can be a flash memory device with shallow trench isolation and triple wells. It is noted that the present method invention is well suited to be implemented in nearly any memory device fabrication process.

Figure 4A:
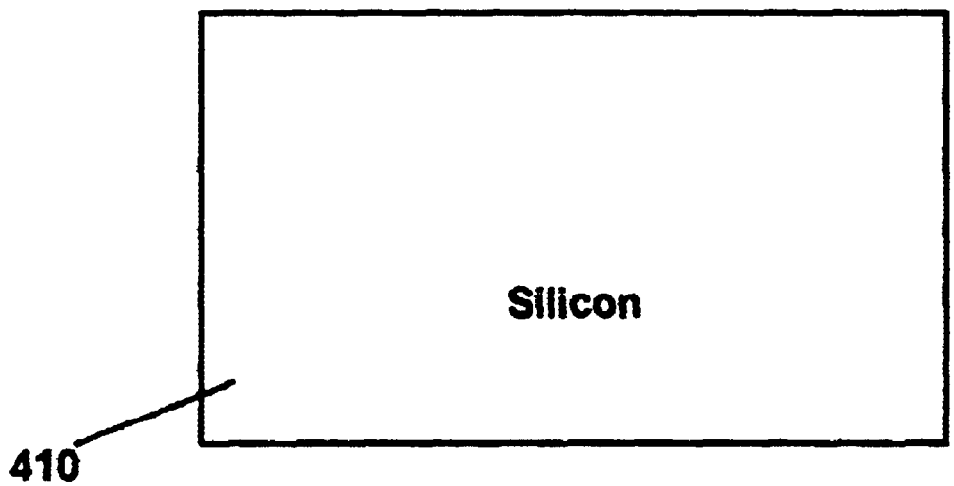
FIG. 4A is an illustration of a substrate of a memory device upon which embodiments of the present invention may be practiced, in accordance with one embodiment of the present invention.

Referring now to FIG. 4A, a silicon (Si) crystal ingot is grown, sliced, and polished in accordance with memory device fabrication processes resulting in silicon (Si) substrate 410.

Figure 4B:
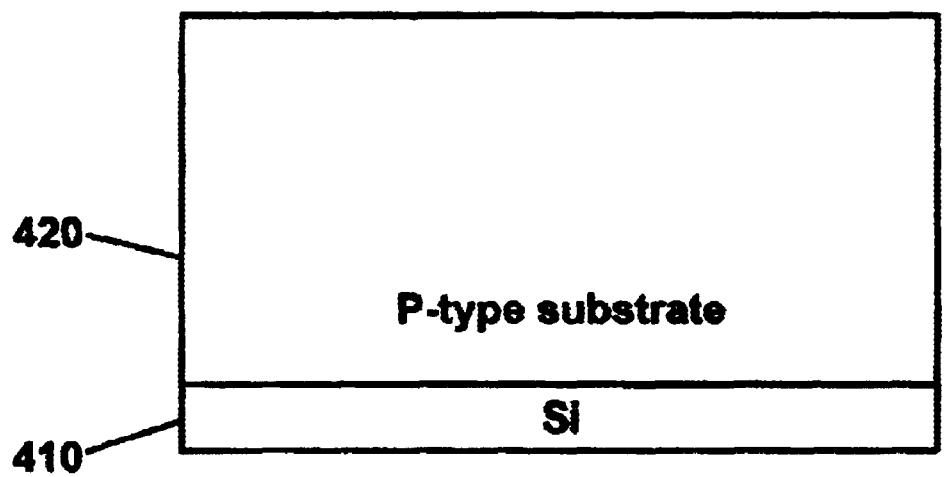
FIG. 4B is an illustration of processes performed upon FIG. 4A that forms a type of substrate therein, in accordance with one embodiment of the present invention.

FIG. 4B is an illustration of memory device 400 showing doping having been performed upon substrate 410 resulting in a formation of a p-type substrate layer 420 within substrate 410, in one embodiment of the present invention.

Figure 4C:
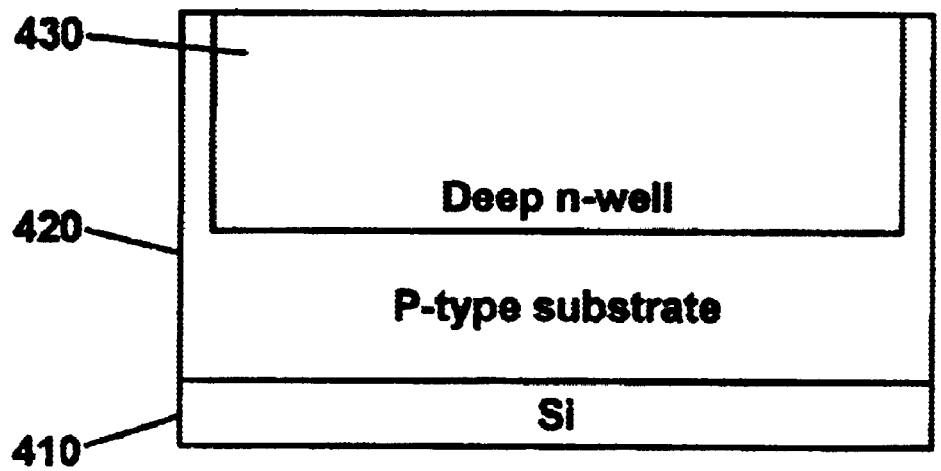
FIG. 4C is an illustration of processes performed upon FIG. 4B that forms a deep well therein, in accordance with one embodiment of the present invention.

FIG. 4C is an illustration of memory device 400 showing doping process having been performed upon substrate 410 and p-type substrate layer 420 resulting in the formation of a deep n-well 430 within p-type substrate layer 420 of substrate 410.

Figure 4D:
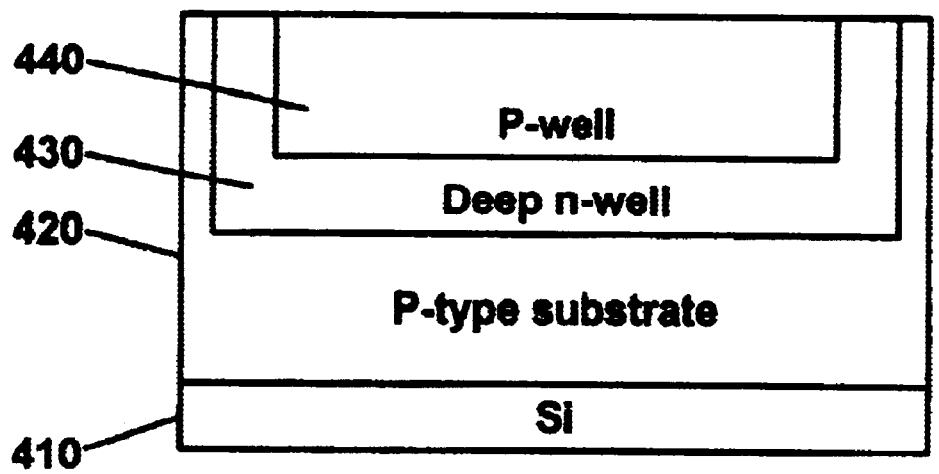
FIG. 4D is an illustration of processes performed upon FIG. 4C that forms a well therein, in accordance with one embodiment of the present invention.

FIG. 4D is an illustration of memory device 400 showing a doping process having been performed upon substrate 410 resulting in the formation of a p-well 440. It is noted that, in one embodiment, p-well 440 is the portion of memory device 400 into which the element germanium is implanted for causing the stretching or straining of a layer of silicon, when formed on top of the portion of p-well 440 which contains the implanted germanium.

Figure 4E:
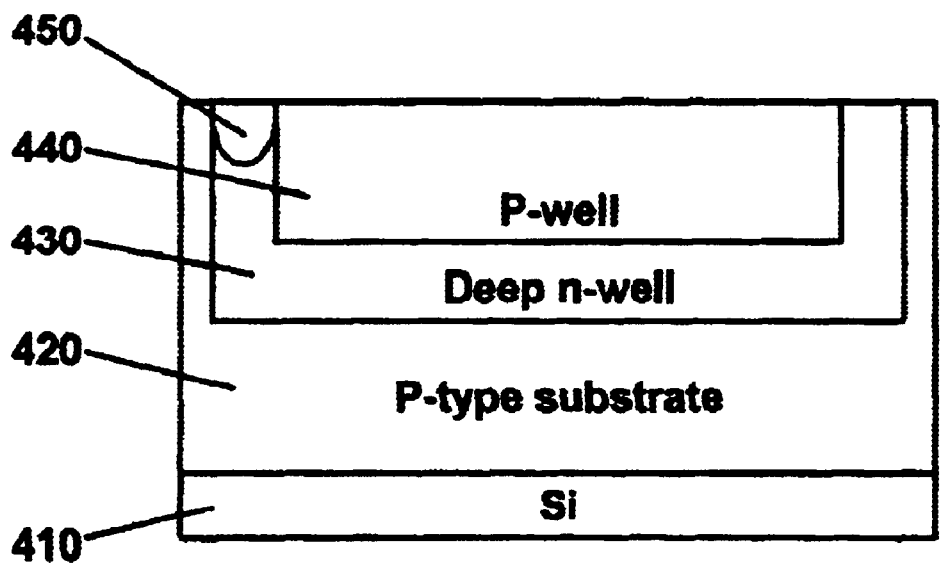
FIG. 4E is an illustration of processes performed upon FIG. 4D that forms a well implant in a deep well, in accordance with one embodiment of the present invention.

FIG. 4E is an illustration of memory device 400 showing the formation of an n+ region 450 within deep n-well 430.

Figure 4F:
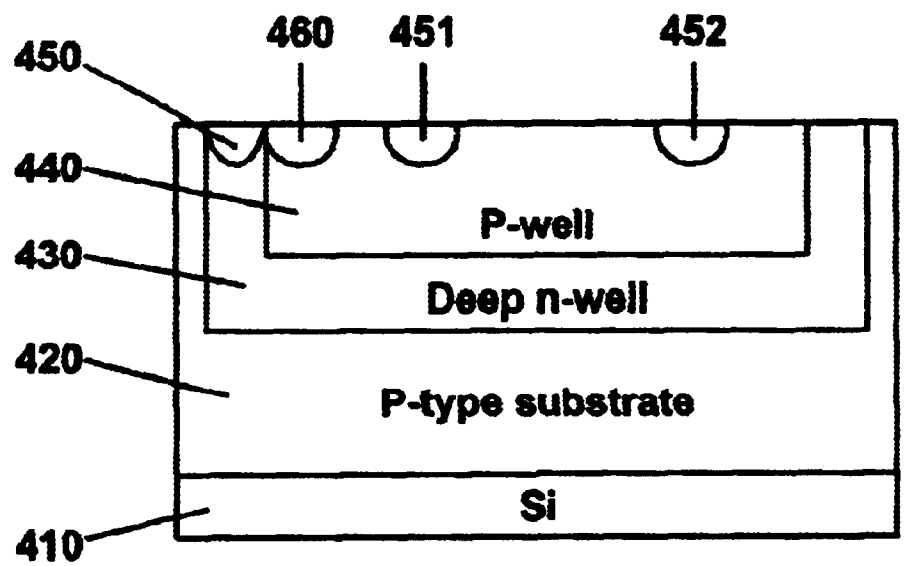
FIG. 4F is an illustration of processes performed upon FIG. 4E that forms a plurality of one type of well implants and another type of well implant, in accordance with one embodiment of the present invention.

FIG. 4F is an illustration of memory device 400 showing the formation of a p+ region 460 and the formation of a source region 451 and a drain region 452, in accordance with one embodiment of the present invention.

It is noted that processes and procedures associated with shallow trench isolation, e.g., anisotropic isolation, thermal oxidation, oxide fill by CVD (chemical vapor deposition), CMP, and the like, have been previously performed upon substrate 410. Additionally, the present invention is also well suited to having triple well maskings and a triple well mask defect inspections performed upon substrate 410. Further, photo-lithographic processes, etching, thermal, and implant steps have also been performed upon substrate 410. These and other processes and procedures have not be shown or described so as to not unnecessarily obscure the present invention.

Figure 4G:
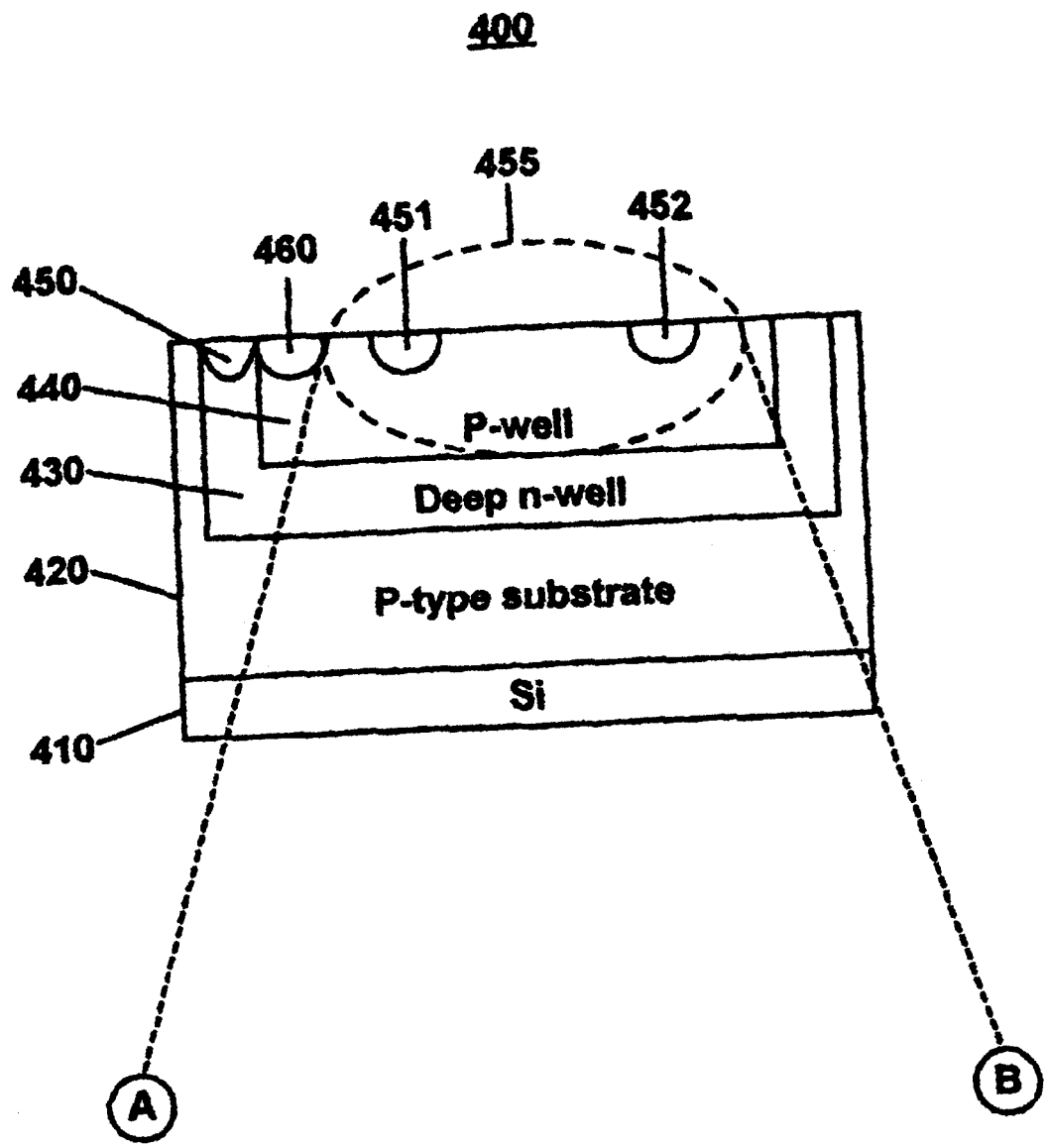
FIG. 4G is an illustration of the memory device of FIG. 4F indicating a section thereof to be shown in a zoomed-in perspective, in accordance with one embodiment of the present invention.

FIG. 4G is an illustration of memory device 400 and is analogous to memory device 400 of FIG. 4F. Memory device 400 shows a memory device portion 455, indicated as a dotted line, and which is shown in an expanded perspective in FIG. 4H.

Figure 4H:
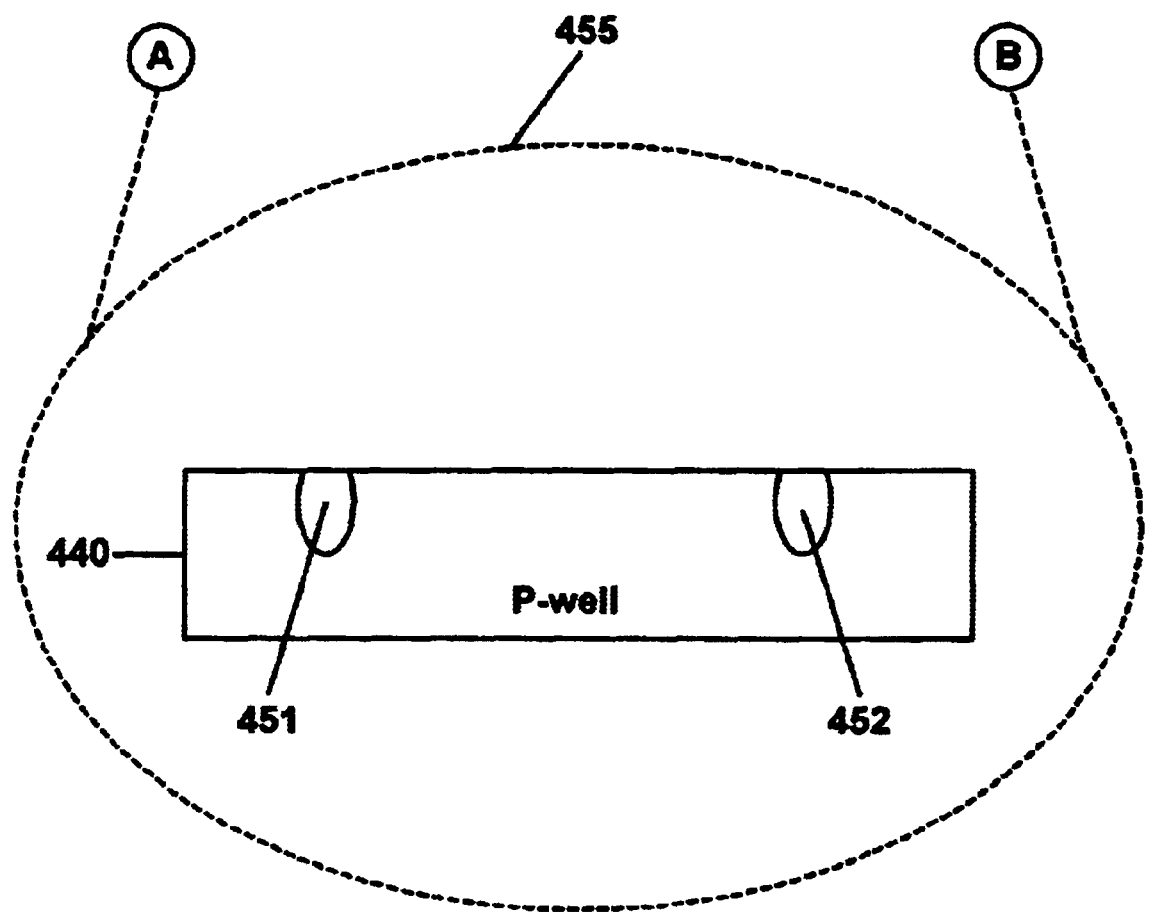
FIG. 4H is an illustration of a section of FIG. 4F in a zoomed-in perspective, in accordance with one embodiment of the present invention.

FIG. 4H is an expanded view of memory device portion 455 of FIG. 4G. Shown in FIG. 4H are p-well 440, source electrode region 451, and drain electrode region 452. Memory device portion 455 is shown prior to performing channel engineering being performed thereon. Channel engineering will be described in detail in FIGS. 5A and 5B.

Figure 5A:
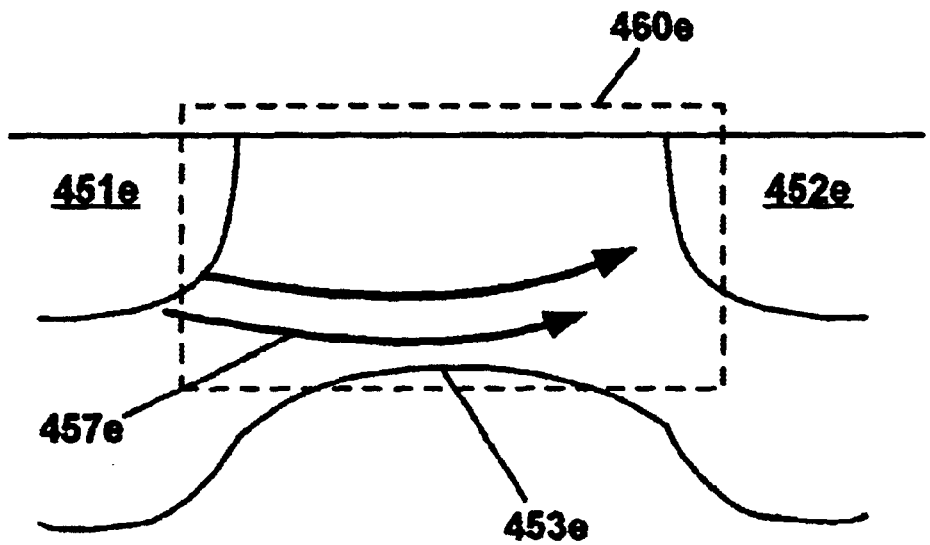
FIG. 5A is an illustration of a section of memory device having an exemplary channel and depletion layer, in accordance with one embodiment of the present invention.
Figure 5B:
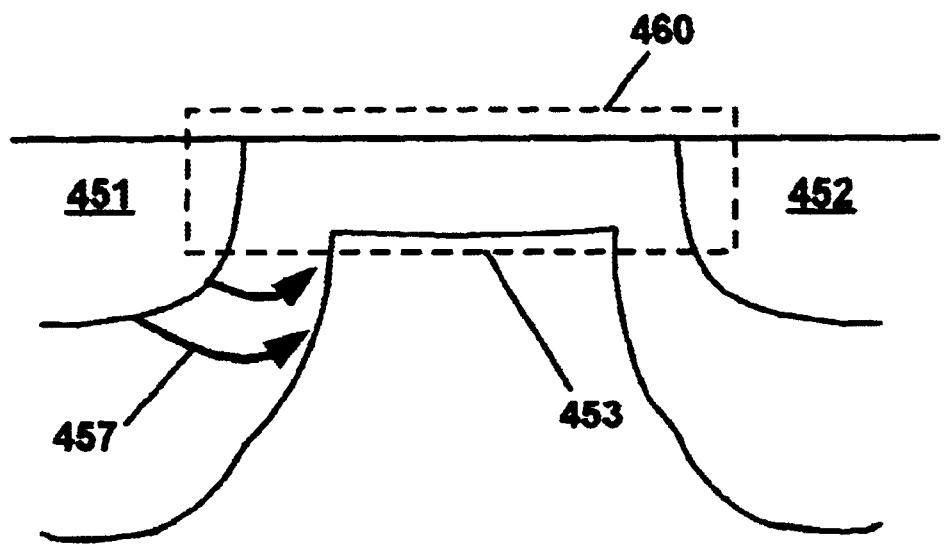
FIG. 5B is an illustration of a section of a memory device depicting a channel and depletion layer subsequent to channel engineering being performed thereon, in accordance with one embodiment of the present invention.

Now referring to FIGS. 5A and 5B, collectively, one embodiment of the present invention is for providing a method of channel engineering in which a channel area of a memory device, e.g., dotted line 460e and 460 of FIGS. 5A and 5B, respectively, is reengineered. Channel areas 460e and 460 are a portion of a memory device interposed between a source region, e.g., 451e of FIG. 5A and 451 of FIG. 5B, and a drain region, e.g., 452e of FIG. 5A and 452 of FIG. 5B, through which electrons flow from the source region to the drain region during memory device operation.

FIG. 5A is an illustration of a portion of an exemplary memory device, memory device portion 454e. Memory device portion 454e is analogous to memory device portion 455 of FIG. 4H. Memory device portion 454e is shown to include a source region 451e, a drain region 452e, and a depletion region 453e. Memory device portion 454e also shows a channel area, as indicated by dotted line 460e. Depletion region 450e is shown as disposed well below the lowest point of the junction depth of source region 451e and drain region 452e. Because depletion region 450e is below regions 451e and 452e, leakage occurs within channel area 460e, as indicated by leakage arrows 457e.

FIG. 5B is an illustration of memory device portion 455 of FIG. 4H subsequent to channel engineering being performed thereon, in one embodiment of the present invention. Memory device portion 455 is shown to include a source region 451, a drain region 452, and a depletion region 453. A channel area between source region 451 and drain 452 (indicated by dotted line 460) has been, in one embodiment, subjected to a process of channel engineering. Channel engineering addresses the leakage problem as described in FIG. 5A. A portion of depletion region 453 is shown to be disposed well above the lowest point of the junction depth of source region 451 and drain region 452, in comparison to depletion region 450e of FIG. 5A. By virtue of depletion region 453, in one embodiment of the present invention, being heightened such that depletion region 453 is now disposed between and does not contact source region 451 and drain region 452, leakage from source region 451 to drain region 452 within channel area 460, shown as leakage arrows 457, is therefore prevented.

Figure 6A:
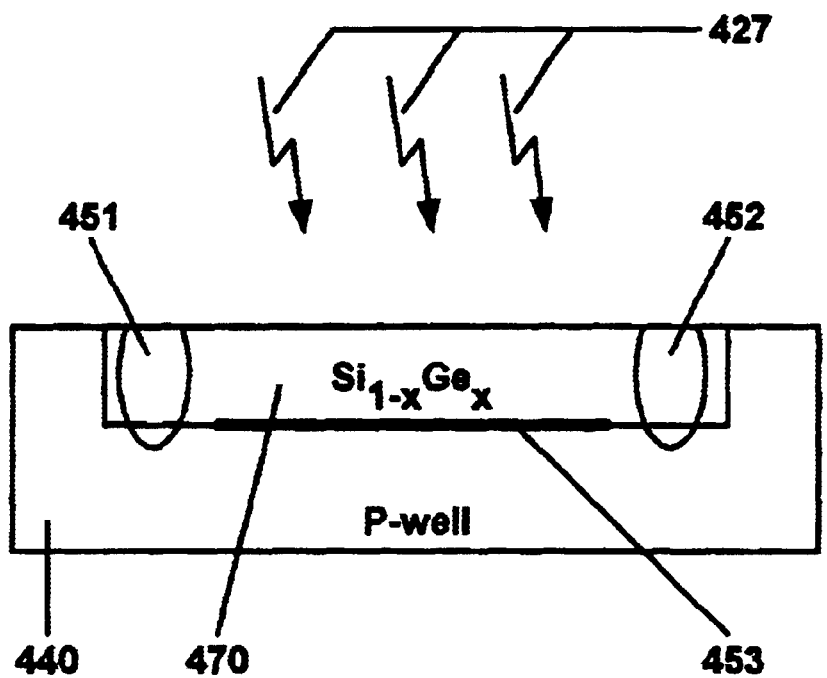
FIG. 6A is an illustration showing processes performed upon the section of memory device of FIG. 4H in which formation of a layer of an another element for atomical realignment of silicon, when silicon is grown thereon, is realized, in accordance with one embodiment of the present invention.

FIG. 6A is an illustration of a memory device portion 455, analogous to memory device portion 455 of FIG. 4H. Memory device portion 455 is comprised of a source region 451, a drain region 452 and a p-well 440. In one embodiment, memory device portion 455 has received channel engineering as described in FIGS. 5A and 5B, as indicated by depletion line 453. Memory device portion 455 shows p-well 440 having received an element implantation, as indicated by layer 470, in one embodiment of the present invention. The element implanted in p-well 440 is, in one embodiment, germanium (Ge), and implantation of the germanium in p-well 440 is via ion implantation. In one embodiment, germanium is implanted in substrate 410 to an approximate depth of 1200 angstroms. A varying amount of energy 427 is used to control the depth of the implantation of germanium into p-well 440. In one embodiment, the amount of energy 427 applied during implantation ranges from five kilo electron volts to forty kilo electron volts. Further, by limiting the number of ions in the element, the concentration of the germanium implanted into a substrate can be controlled. In one embodiment, the concentration of germanium ranges from $2 \times 10^{13}$ to approximately $2 \times 10^{15}$ ions/cm$^2$.

Figure 6B:
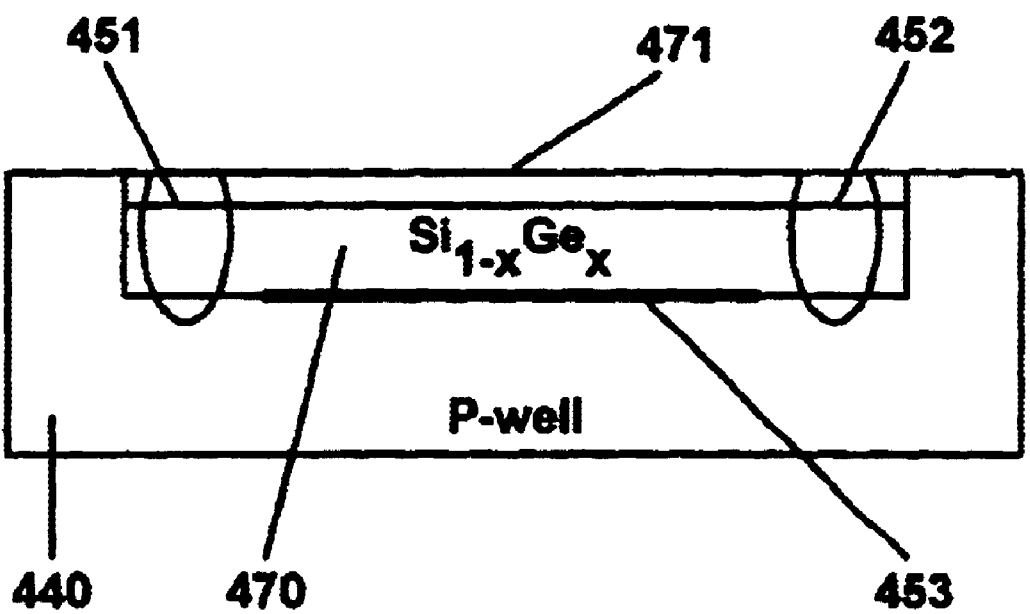
FIG. 6B is an illustration of processes performed upon the section of a memory device of FIG. 6A which forms a layer of atomically realigned silicon thereon, in accordance with one embodiment of the present invention.

FIG. 6B shows a layer of strained silicon 471 having been formed upon germanium implant layer 470, in accordance with one embodiment of the present invention. As was described in FIGS. 3A, 3B, and 6A, by prior implantation of germanium into silicon, a silicon layer 471, when formed on top of germanium silicon ($Si_{1-x}Ge_x$) layer 470, the inherent properties of silicon provide for elongational atomical alignment of the silicon, such that the silicon strains to become equivalently atomically aligned to the atomical alignment of the germanium upon which is was formed. In one embodiment, the thickness of the strained silicon layer 471 is between one hundred and one hundred and fifty angstroms.

Figure 6C:
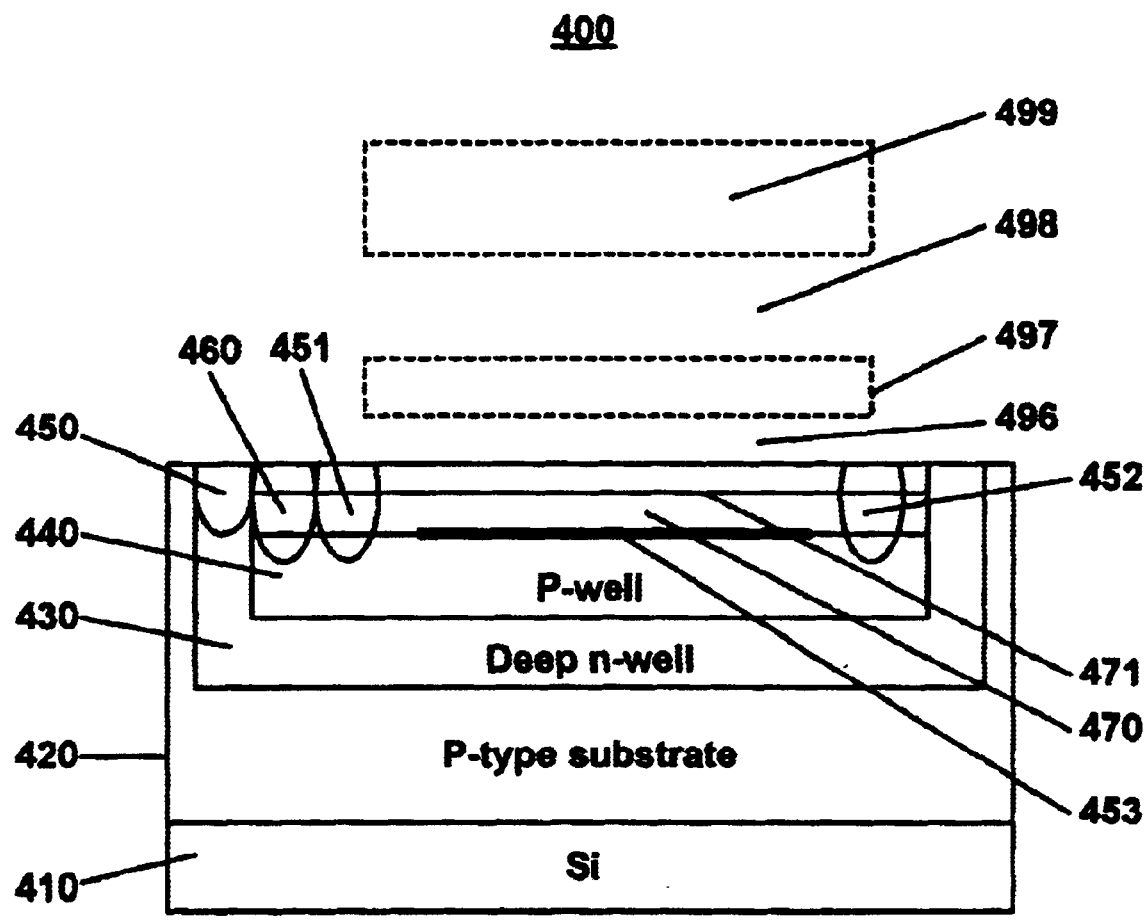
FIG. 6C is an illustration of a memory device of FIG. 6B depicting the components to be integrated therein and processes to be performed thereon, subsequent to completion of the processes of FIGS. 6A and 6B, in accordance with one embodiment of the present invention.

FIG. 6C is an illustration of memory device 400, subsequent to channel engineering and germanium implantation, in one embodiment of the present invention. Shown are substrate 410, p-type substrate 420, deep n-well 430, p-well 440, n+region 450, source region 451, drain region 452, p+region 460, germanium implant layer 470, and strained silicon layer 471. Subsequent to the crystallization of strained silicon layer 471 via rapid thermal annealing (RTA), as described in FIG. 6B, a thermal oxide layer 496, a first polysilicon layer 497, a oxide nitride oxide layer 498, and a second polysilicon layer 499 can be then disposed above strained silicon layer 471, in preparation for completion of the fabrication of memory device 400, in one embodiment of the present invention.

FIG. 7 is a flowchart 700 of steps performed in accordance with one embodiment of the present invention for incorporating strained silicon in the fabrication of a memory device, such as a flash memory device. Flowchart 700 includes processes of the present invention which, in one embodiment, are carried out by memory device fabrication equipment under the control of computerized and/or operator initiated instructions. Although specific steps are disclosed in flowchart 700, such steps are exemplary. That is, the present invention is well suited to performing various other steps or variations of the steps recited in FIG. 7. Within the present embodiment, it should be appreciated that the steps of flowchart 700 may be performed by memory device fabrication equipment, controlled by computerized instructions, operator initiated instructions, or a combination of computerized and operator initiated instructions.

In step 702 of FIG. 7, an element, e.g., germanium 201 of FIG. 2A, is implanted into a substrate, e.g., substrate 440 of FIG. 6A, creating germanium silicon ($Si_{1-x}Ge_x$) layer 470. Energy, e.g., energy 427 of FIG. 6A, is used for implanting the germanium 201 in the substrate 440. By varying the amount of energy 427 used to implant germanium, the depth of germanium implanted into the substrate 440 can be controlled. In one embodiment, germanium 201 is implanted in substrate 440 to a depth of approximately 1200 angstroms and energy 427 is applied in an amount ranging from five KeV to 40 KeV.

In step 704 of FIG. 7, in one embodiment and subsequent to germanium implantation as described above, a layer of silicon, e.g., silicon layer 471 of FIG. 6B is formed on germanium implanted layer 470. As was described in FIGS. 3A and 3B, when silicon is formed on germanium, the silicon's atoms realign themselves to be equivalent to that of the atomical alignment of the germanium. Thus, the atomical alignment of silicon 1 upon layer 470 inherently strains/ stretches to become aligned equivalently to the germanium implanted layer 470.

In step 706 of FIG. 7, in one embodiment and subsequent to the forming and atomical realignment of the silicon formed on layer 470, memory device 400 is core annealed. In one embodiment, the core annealing is a rapid thermal anneal (RTA). By annealing memory device 400, the silicon, e.g., strained silicon 101 is crystallized, thus providing an elongated silicon crystal that achieves a decrease in electron scattering and accordingly increases mean free path thereby increasing core gain in the memory device as compared to memory devices with unstrained silicon.

FIG. 8 is a flowchart 800 of steps performed in accordance with one embodiment of the present invention for channel engineering in the fabrication of a memory device, such as a flash memory device. Flowchart 800 includes processes of the present invention which, in one embodiment, are carried out by memory device fabrication equipment under the control of computerized and operator initiated instructions. Although specific steps are disclosed in flowchart 800, such steps are exemplary. That is, the present invention is well suited to performing various other steps or variations of the steps recited in FIG. 8. Within the present embodiment, it should be appreciated that the steps of flowchart 800 may be performed by memory device fabrication equipment, controlled by computerized instructions, operator initiated instructions, or a combination of computerized and operator initiated instructions.

In step 802 of FIG. 8, in one embodiment, a depletion layer, e.g., depletion layer 450e of FIG. 5A, shown as being disposed below a lowest junction depth of a source region (source region 451e) and a drain region (drain region 452e) of a memory device, e.g., memory device 400, is heightened, as shown in FIG. 5B, so that depletion layer 453 (FIG. 5B) is interposed between and separate from source region 451 and drain region 452. By heightening depletion layer 453, as shown in FIG. 5B, leakage, e.g., leakage 457e of FIG. 5A, associated with an unheightened depletion layer 450e is inhibited, as shown by leakage 457 of FIG. 5B.

In step 804 of FIG. 8, in one embodiment, a channel, e.g., silicon layer 471 of FIG. 6B is formed therewith. Silicon layer 471 is through which electrons flow from source region 451 to drain region 452 in FIG. 6B. It is noted that silicon layer 471 is formed upon substrate 470, subsequent to germanium 201 implanted in substrate 440, as described in FIG. 6A.

In step 806 of FIG. 8, by controlling the heightening of depletion layer 453 to be interposed between and separate from source region 451 and drain region 452, as shown in FIG. 5B, leakage, shown as leakage 457 in FIG. 5B is inhibited.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of memory device fabrication comprising:

implanting an element (200) in a substrate (440), said element (200) causing an elongational realignment of atoms in silicon (101g) when said silicon (100) is formed upon said substrate (440) with said element (200) implanted therein;

forming a layer of silicon (471) on said substrate (440) having said element (200) implanted therein (470), wherein alignment of atoms (101) of said silicon (100) elongates to an atomical alignment (101g) equivalent to said element (200); and crystallizing said layer of silicon (471) and said substrate (440), subsequent to said elongational realignment of atoms of said layer of silicon (101g), wherein a crystallized layer of elongated silicon (101g) decreases electron scattering (220) thus realizing increased core gain in said memory device.

2. The method as recited in claim 1 wherein said implanting of said element (200) in said substrate (440) is through ion implantation.

3. The method as recited in claim 1 further comprising controlling the thickness of said layer of silicon (471) on said substrate having said element implanted therein (470).

4. The method as recited in claim 1 wherein said substrate is substantially silicon (100).

5. The method as recited in claim 1 wherein said element (200) implanted in said substrate (440) is germanium.

6. The method as recited in claim 1 wherein said memory device is a flash memory device (400).

7. The method as recited in claim 1 wherein said crystallizing further comprises core annealing of said layer of silicon (471) and said substrate (470), said core annealing a rapid thermal anneal.

* * * * *